United States Patent [19]

Tsujimoto

[11] Patent Number: 5,673,270
[45] Date of Patent: Sep. 30, 1997

[54] SEMICONDUCTOR MEMORY DEVICE HAVING REGISTER FOR HOLDING TEST RESULTANT SIGNAL

[75] Inventor: Akira Tsujimoto, Tokyo, Japan

[73] Assignee: NEC Corporation, Tokyo, Japan

[21] Appl. No.: 527,761

[22] Filed: Sep. 13, 1995

Related U.S. Application Data

[63] Continuation of Ser. No. 225,810, Apr. 11, 1994, abandoned.

[30] Foreign Application Priority Data

Apr. 9, 1993 [JP] Japan .................. 5-083190

[51] Int. Cl.$^6$ .................. G11C 29/00
[52] U.S. Cl. .......... 371/21.1; 371/21.2; 371/20.4; 365/189.01; 365/208; 365/230.08
[58] Field of Search .................. 371/21.1, 21.2, 371/21.3, 20.4, 22.1, 10.2, 27; 365/189.01, 189.04, 189.05, 201, 208, 230.08, 189.08; 395/183.05, 183.18

[56] References Cited

U.S. PATENT DOCUMENTS

| | | | |
|---|---|---|---|
| Re. 34,445 | 11/1993 | Hayes et al. | 371/21.1 |
| 4,503,536 | 3/1985 | Panzer | 371/25.1 |
| 4,667,330 | 5/1987 | Kumagai | 371/21.1 |
| 4,682,331 | 7/1987 | Mori | 371/25.1 |
| 4,757,503 | 7/1988 | Hayes et al. | 371/21.1 |
| 4,821,238 | 4/1989 | Tatematsu | 365/201 |
| 5,034,923 | 7/1991 | Kuo et al. | 365/189.01 |
| 5,132,937 | 7/1992 | Tuda et al. | 365/201 |
| 5,151,881 | 9/1992 | Kajigaya et al. | 365/201 |
| 5,185,744 | 2/1993 | Arimoto et al. | 371/21.2 |
| 5,204,837 | 4/1993 | Suwa et al. | 371/21.2 |
| 5,241,501 | 8/1993 | Tanaka | 371/21.2 |
| 5,278,839 | 1/1994 | Matsumoto et al. | 371/21.2 |
| 5,291,449 | 3/1994 | Dehara | 371/21.2 |
| 5,311,473 | 5/1994 | McClure et al. | 365/201 |
| 5,406,566 | 4/1995 | Obara | 371/21.2 |
| 5,436,910 | 7/1995 | Takeshima et al. | 371/21.1 |
| 5,457,696 | 10/1995 | Mori | 371/21.3 |

OTHER PUBLICATIONS

M. Kumanoya et al., "A 90ns 1Mb DRAM with Multi–Bit Test Mode", *1985 IEEE International Solid–State Circuits Conference*, Feb. 15, 1985, pp. 240–241.

*Primary Examiner*—Robert W. Beausoliel, Jr.
*Assistant Examiner*—Dieu-Minh Le
*Attorney, Agent, or Firm*—Sughrue, Mion, Zinn, Macpeak & Seas

[57] ABSTRACT

Disclosed herein is a semiconductor memory device having a memory cell array, a write/read circuit which writes during a test mode a plurality of identical data to the memory cell array in response to input addresses and reads the plurality of data from the memory cell array in response to the same addresses, a comparison data register which stores data identical to the plurality of data written to the memory cell array during the test mode, a decision circuit which compares the plurality of data read from memory cell array and the data stored in the comparison data register to decide whether the data compared coincide, and outputs a decision signal, and a decision result register which is reset immediately after the start of the test mode and is set to a set level in response to a decision signal of noncoincidence level and remains set state until it is reset again.

7 Claims, 6 Drawing Sheets

SEMICONDUCTOR MEMORY DEVICE HAVING REGISTER FOR HOLDING TEST RESULTANT SIGNAL

This is a Continuation of application Ser. No. 08/225,810 filed Apr. 11, 1994, now abandoned.

BACKGROUND OF THE INVENTION

1. Field of the Invention

The present invention relates to a semiconductor device and, more particularly, to a semiconductor memory device capable of executing data write and read test operation on a plurality of bits in parallel to one another.

2. Description of the Prior Art

In recent years, the increase in testing time of a memory device is concerned in accordance with increase in number of bits or memory cells (called hereinafter "bit number") thereof. This is because each memory cell is required to be written with test data and the test data is then read out therefrom so that the testing time is increased in proportion to the increase of the bit number of the memories. In particular, the memory capacity has been quadrupled in every 3 or 4 years, so that the increase in the testing time has become a problem that cannot be ignored.

In order to deal with such a problem, a semiconductor memory device equipped with a test circuit which is activated during a test mode to write and read test data in and from a plurality of memory cells was proposed as disclosed in ISSCC 85 Digest of Technical Papers, pp. 240–241, titled "A 90ns 1Mb DRAM with Multi-Bit Test Mode". Namely, during the test mode, the test data having logic "1" or "0" is written simultaneously into four memory cells, and the test data thus written are then read out therefrom simultaneously, to detect whether or not the four test data are coincident with one other. If any one of them is noncoincident with the remaining data, a noncoincidence detection signal is output as a defective bit detection signal to inform the defectiveness of the memory cell or cells. By the provision of such a circuit, a reduction in the testing time is effected.

However, in this test circuit, the noncoincidence detection signal is valid only during one test access operation for four memory cells. For this reason, the defective bit detection signal has to be monitored every one test access operation, i.e., every four memory cells. As a result, while the test time for one memory device is shortened, the total test time for one test board including a plurality of memory devices are not reduced as expected. This will be further described in the following by referring to FIG. 1.

Specifically, it is general to carry out tests for a large number of memory devices in parallel by loading memory devices on a monitor burn-in-test board 101 in a matrix form of m×k, as shown in FIG. 1. However, in order to carry out the test for all memories simultaneously in a batch, there are needed signal lines for m×k defective bit detection signals, and comparators for monitoring the defective bit detection signals. Since, however, for the reasons that a large number of signal lines are required and the comparator is expensive, in reality, a configuration is adopted in which one input and output signal line DI/O and one comparator C are shared among m memories in the column direction (for example, from MIC11 to MICm1). Since it is necessary to monitor the defective bit detection signal at the time of test as mentioned above, test can be given at the same time to only k memories (for example, from MIC11 to MIC1k) in one row direction. Accordingly, to test all the memories it is necessary to repeat the test for every row, in other words, to carry out the test m times for k memories (for example, m=15 and k=16).

In the 4-bit parallel test, if the total number of 4-bit sets of the memories is designated M and one cycle time (read and write) is Tc, and if it is assumed that the so-called "9N marching test" (N being the bit number of the memory) as one of the test methods is adopted, the testing time is given by m×9N×M×Tc which leads to a problem that the testing time is too long. Moreover, since the test decides whether the read data of plural bits are coincide or not, the read data are decided to be in coincidence even if all of the read data are changed to the same level that are different from the written data. In other words, the method has a problem that the failure in which all bits are inverted cannot be detected.

BRIEF SUMMARY OF THE INVENTION

Objects of the Invention

It is therefore an object of the invention to provide a semiconductor memory device which reduce the testing time when it is loaded onto the conventional memory test device.

It is another object of the invention to provide a semiconductor device which is capable of detecting an all-bit inversion failure of the memories.

Summary of the Invention

The semiconductor memory device according to this invention comprises a memory circuit capable of writing and reading a plurality of data at the same time, a plurality of write and read data buses connected to the memory circuit, a data write/read circuit which during the test mode writes simultaneously a plurality of data of the same level to predetermined address regions of the memory circuit, and later reads the plurality of data stored in the same addresses, a comparison data register which stores the data identical to the plurality of data written by the data write/read circuit to the memory circuit, a decision circuit which decides whether the plurality of data read from the memory circuit agree entirely with the data stored in the comparison data register, and generates a decision signal of coincidence level or noncoincidence level, a decision result register which is reset by a reset signal generated only once immediately after the device entered the test mode and is set to a set level in response to a noncoincidence level of the decision signal, and holds the state until the next reset signal is generated, and a decision result read circuit which reads the contents of the decision result register.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 2:
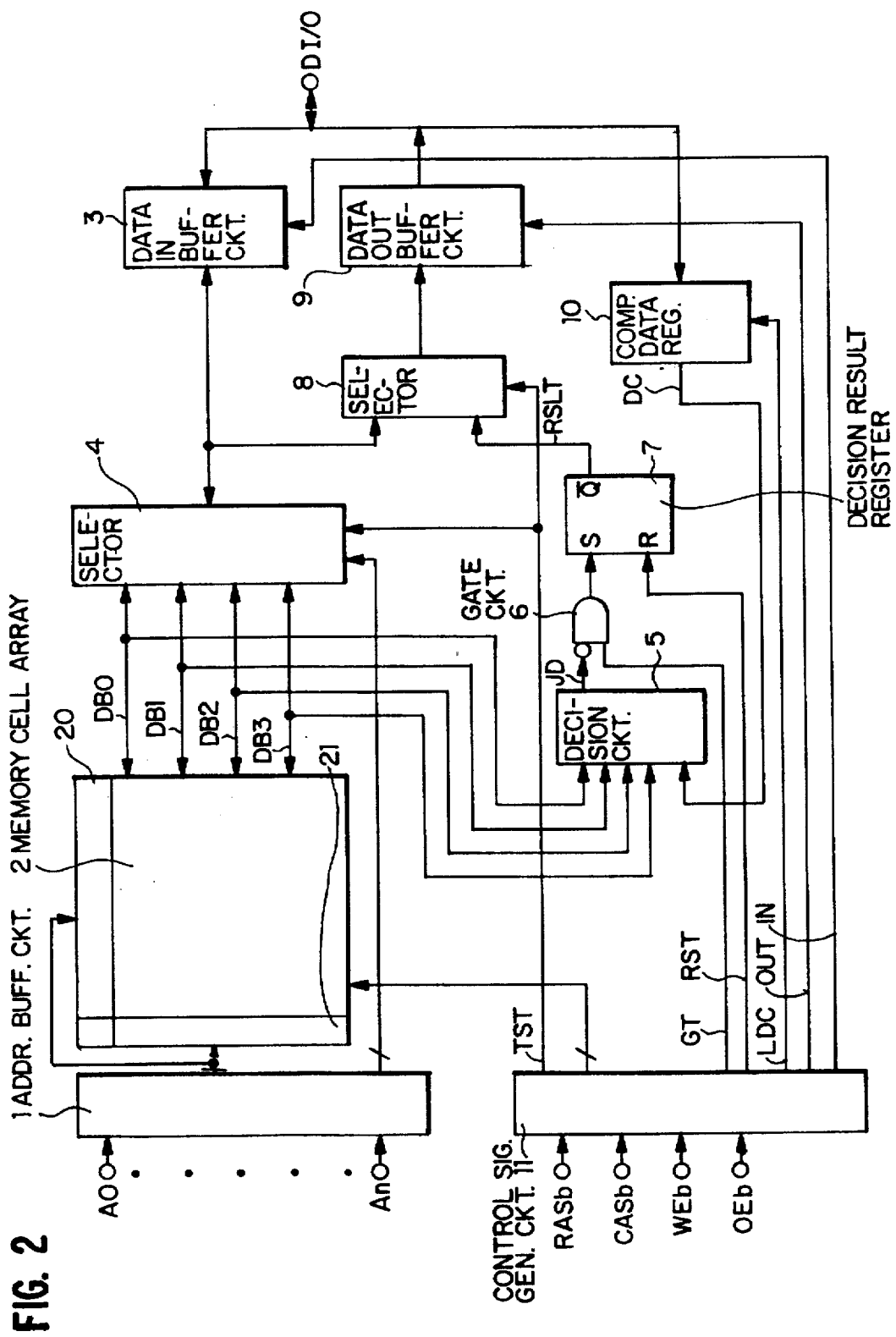
FIG. 2 is a block diagram for a semiconductor memory device showing a first embodiment of the invention.

Referring to FIG. 2 showing the first embodiment of the invention, this embodiment has a memory cell array of dynamic random access memories (DRAMs), and the invention will be described by taking a semiconductor device which carries out simultaneously the write/read of 4 bits at the test time. A memory cell array 2 is a DRAM memory cell array in which memory cells MC are arranged in array at the intersections of a plurality of word lines WL and bit lines BL. Each memory cell is of the so-called one-transistor one-capacitor type. Address signals A0 to An supplied via an address buffer 1 are supplied to a column decoder 20 and a row decoder 21, and memory cells corresponding to the address signals are selected. Data buses DB0 to DB3 are operatively coupled to four memory cells of the memory cell array 2 selected by the address. A selector 4 is a circuit which selects one of the data buses DB0 to DB3 according to predetermined two bits of the address signals A0 to An when a test mode signal TST is at an inactive level, and selects all of the data buses DB0 to DB3 when the test mode signal TST is at the active level. A comparison data register 10 is a register which stores data DC for comparison corresponding to a latch signal LDC. A decision circuit 5 decides whether or not read-data of 4 bits supplied from the data buses DB0 to DB3 and data stored in the comparison data register 10 are coincident with one another, and outputs a decision signal JD of coincidence or noncoincidence level. A gate circuit 6 outputs a decision signal JD when a gate signal GT is at the active level. The gate circuit 6 is provided to prevent malfunction of a decision result register 7 due to a spike noise caused by skew mismatch of the input signal to the decision circuit. The decision result register 7 is reset by a register reset signal RST and set to a set level in response to the noncoincidence level of the decision signal transmitted from the gate circuit, and holds the set level until the next generation of the register reset signal RST. A selector 8 selectively outputs 1-bit read data output from the selector 4 when the test mode signal TST is at the nonactive level, and selectively outputs a decision result signal RSLT of the decision result register when the test mode signal TST is at the active level. A data-in buffer circuit 3 fetches and outputs a 1-bit data supplied to an input and output terminal DI/O in response to the level of a data input signal IN. A data-out buffer circuit 9 outputs data selected by the selector 8 to the input and output terminal DI/O in response to the level of a data output signal OUT. A control signal generating circuit 11 generates the test mode signal TST, gate signal GT, register reset signal RST, latch signal LDC, output signal OUT and data input signal IN in response to the mutual level relation of a row address strobe signal RASb, column address strobe signal CASb, write enable signal WEb and output enable signal OEb.

Next, referring also to FIG. 3 to FIG. 7, the operation of this embodiment will be described. When the test mode signal TST is at the nonactive level (low level), normal write and read (normal mode) is carried out, and when the test mode signal TST is at the active level (high level), write and read of test data, coincidence decision of data read out and read of the decision result (test mode) are carried out.

Figure 3:
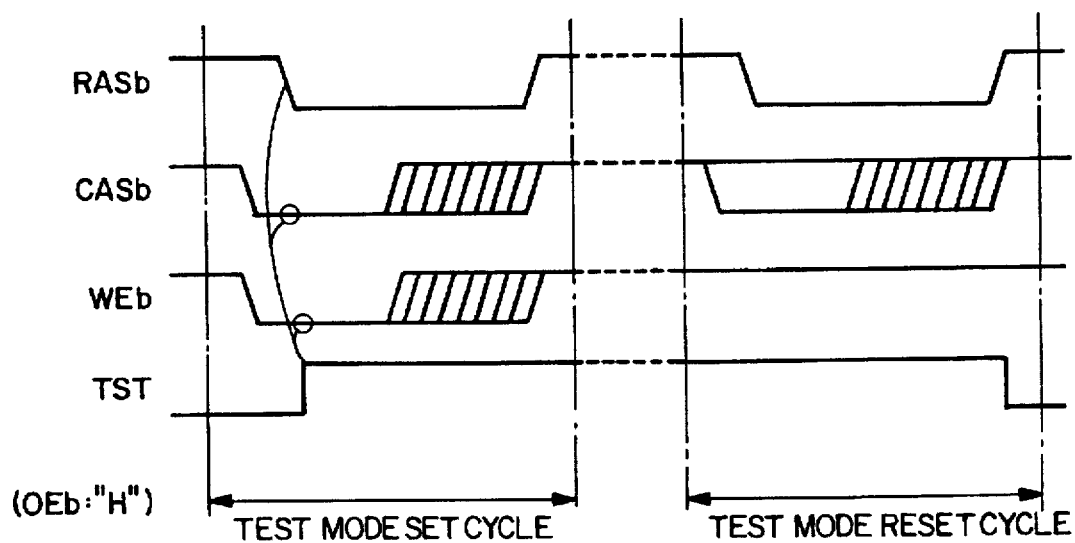
FIG. 3 is a waveform diagram showing the test mode set cycle and the test mode reset cycle of the semiconductor memory device shown in FIG. 2.

As shown in FIG. 3, when Write CAS Before RAS (WCBR) cycle is executed, the test mode is set, and the control signal generating circuit 11 changes the test signal TST to the active level. On the other hand, when RAS Only cycle or CAS Before RAS cycle is executed, the test mode is reset, and the control signal generating circuit 11 sends the test signal TST to the inactive level.

First, the operation of this embodiment during the normal mode will be described briefly. Since the test mode signal TST is at the nonactive level (low level) during the normal mode, the selector 4 selects one line out of data buses DB0 to DB3 in response to predetermined 2 bits among column address signals fetched to the address buffer circuit 1 (see FIG. 2)

During the write cycle, the data input signal IN of the control signal generating circuit 11 goes to the active level synchronized with the activation (low level) of the write enable signal WEb. Accordingly, the data-in buffer circuit 3 supplies a 1-bit write data to the selector 4. The write data is supplied to the memory cell array 2 via one line out of the data buses DB0 to DB3 selected by the selector 4. Memory cells are selected by the column decoder 20 and the row decoder 21 corresponding to the input addresses A0 to An, and the write data are stored.

During the read cycle, 1-bit data out of 4-bit data read out in response to the input addresses A0 to An is selected by the selector 4, and it is supplied to the selector 8. The selector 8 supplies the 1-bit data read out, supplied by the selector 4 in response to the nonactive level of the test mode signal TST, to the data-out buffer circuit 9. Since the control signal generating circuit 11 sends the data output OUT to the active level in response to the activation (low level) of the output enable signal OEb, the data-out buffer circuit 9 outputs the data read-out to the input and output terminal DI/O.

Figure 4:
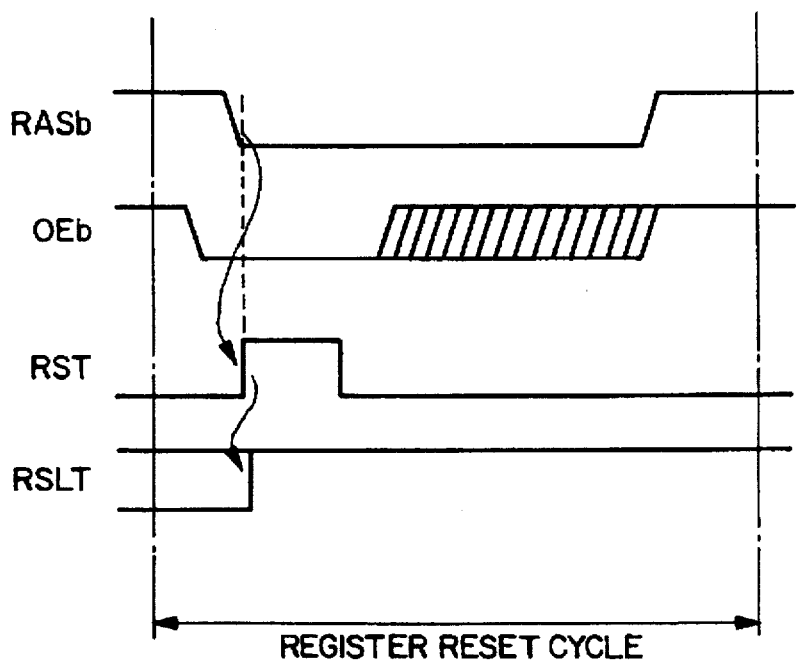
FIG. 4 is a waveform diagram showing the register reset cycle of the semiconductor memory device shown in FIG. 2.

Next, the test mode operation of this embodiment will be described. After execution of the test mode set cycle shown in FIG. 3, if the output enable signal OEb is at the active level (low level) at the time of transition of the row address strobe signal RASb to the active level (low level), as shown in FIG. 4, the control signal generating circuit 11 outputs a register reset signal RST with a predetermined width. The decision result register 7 is reset in response to the register reset signal RST. The above-mentioned operation represents the register reset cycle which is executed just once immediately after the system entered the test mode.

Figure 5:
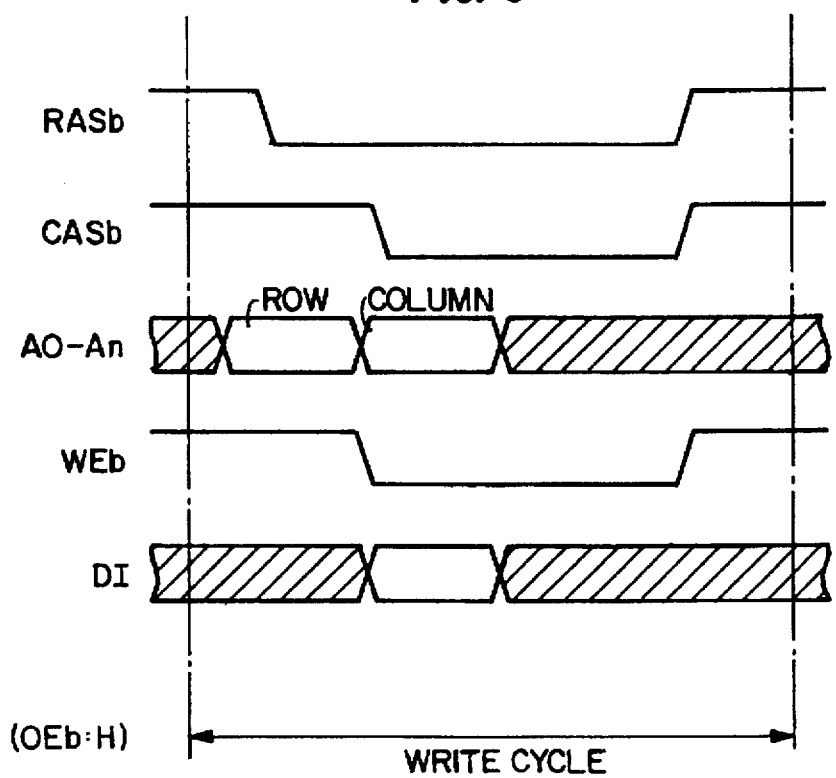
FIG. 5 is a waveform diagram showing the write cycle of the semiconductor memory device shown in FIG. 2.
Figure 6:
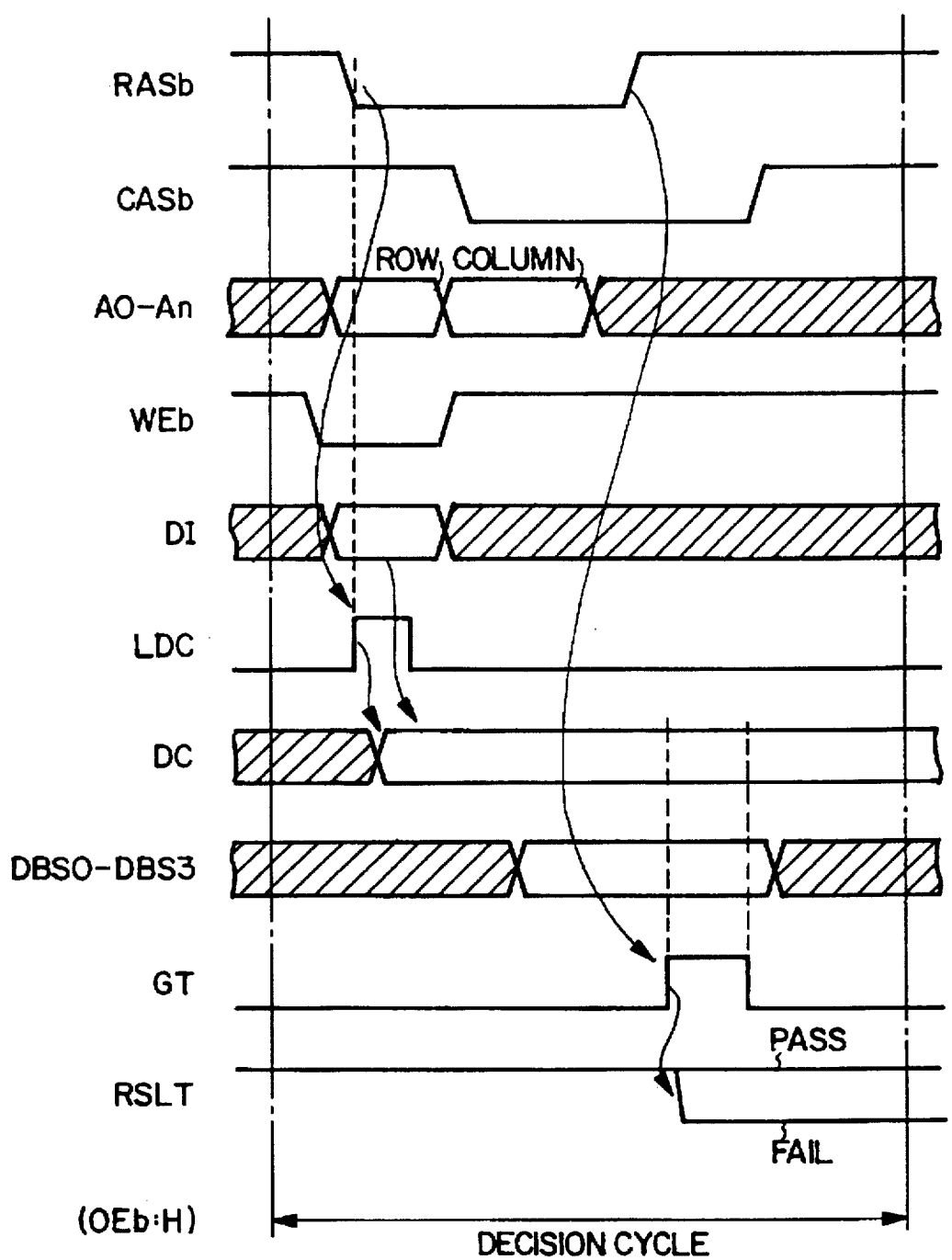
FIG. 6 is a waveform diagram showing the decision cycle of the semiconductor memory device shown in FIG. 2.

Next, a write cycle shown in FIG. 5 and a decision cycle shown in FIG. 6 are executed repeatedly according to a predetermined test pattern (for example, the 9N marching system).

During the write cycle, in the control signal generating circuit 11 the data input signal IN goes to the active level synchronized with the activation (low level) of the write enable signal WEb. Accordingly, the data-in buffer circuit 3 supplies a 1-bit write data to the selector 4. Since the test mode signal TST is at the active level (high level) during the test mode, the selector 4 supplies data of the same level to all of the data buses DB0 to DB3. As a result, data of one set of 4 bits with the same level are written to memory cells corresponding to the input addresses A0 to An.

Next, the decision cycle is executed continuously. First, if the nonactivation level (high level) of the column address strobe signal CASb and the activation level (low level) of the write enable signal WEb are detected during the transition of RASb signal to the activation level, the control signal generating circuit 11 generates a latch signal LDC having a predetermined pulse width. In response to the latch signal LDC, comparison data DC of the same level as the data written in the write cycle are supplied from the input and output terminal DI/O, and are stored. In parallel with this, one set of data of 4 bits corresponding to the input addresses A0 to An are read from the memory cell array 2, and are supplied to the decision circuit 5. The decision circuit 5 decides whether the comparison data and all of the one set data of 4 bits coincide. The decision signal JD having a level corresponding to coincidence or noncoincidence is supplied to the decision result register 7 via the gate circuit 6 in response to the gate signal GT which is generated by detecting the activation level of the signal CASb and the nonactivation of the signal WEb at the time of transition of the signal RASb to the nonactive level. The decision result register 7 converts the contents of the decision signal from reset level (PASS) to set level (FAIL) only when it indicates noncoincidence, and holds this state thereafter.

Accordingly, when the decision signal JD shows coincidence all the time, namely, when the read out and write operation of this semiconductor device are normal, a decision result signal RSLT showing the reset level (PASS) is output from the decision result register 7. On the other hand, if the decision signal JD shows noncoincidence once, if there occurred a malfunction once in the write, read, memory, or the like operation, the circuit outputs a decision result signal RSLT of the set level (FAIL).

Figure 7:
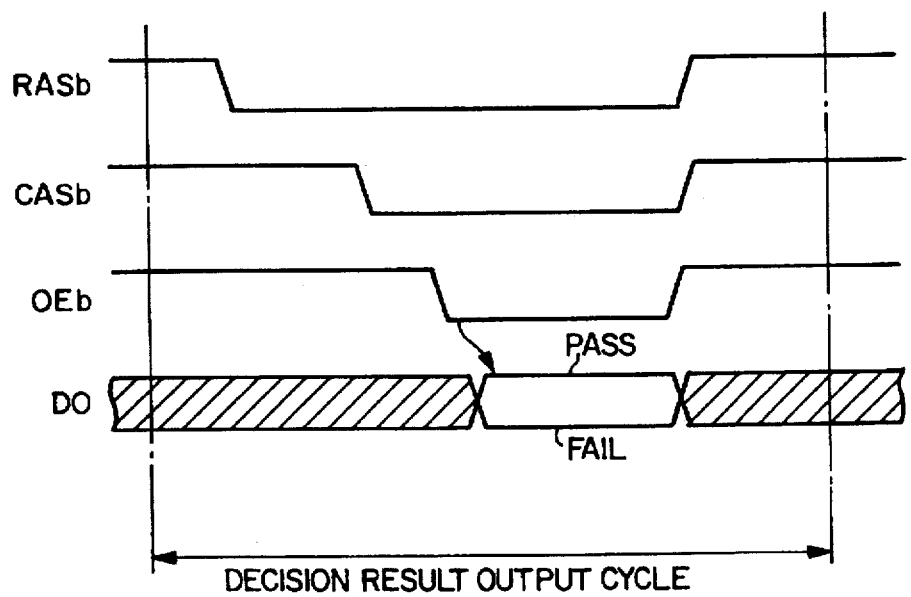
FIG. 7 is a waveform diagram showing the decision result output cycle of the semiconductor device shown in FIG. 2.

After repetitive execution, and completion of the above-mentioned read cycle and decision cycle for all the addresses of one set of 4 bits according to a predetermined pattern (for example, the 9N marching system), a decision result output cycle shown in FIG. 7 is executed. The decision result output cycle is executed when the signal OEb is brought to the active level after the signal RASb and the signal CASb sequentially made transition to the active level. The decision result signal RSLT is output to the input and output terminal DI/O via the selector 8 and the data out buffer 9.

In accordance with the above-mentioned constitution of the semiconductor device, the decision circuit 5 is detecting coincidence of the data of one set of 4 bits read from the memory cell array 2 and the data stored in the comparison data register, so that it is possible to detect the all-bit inversion failure which was unable to be detected conventionally.

Figure 1:
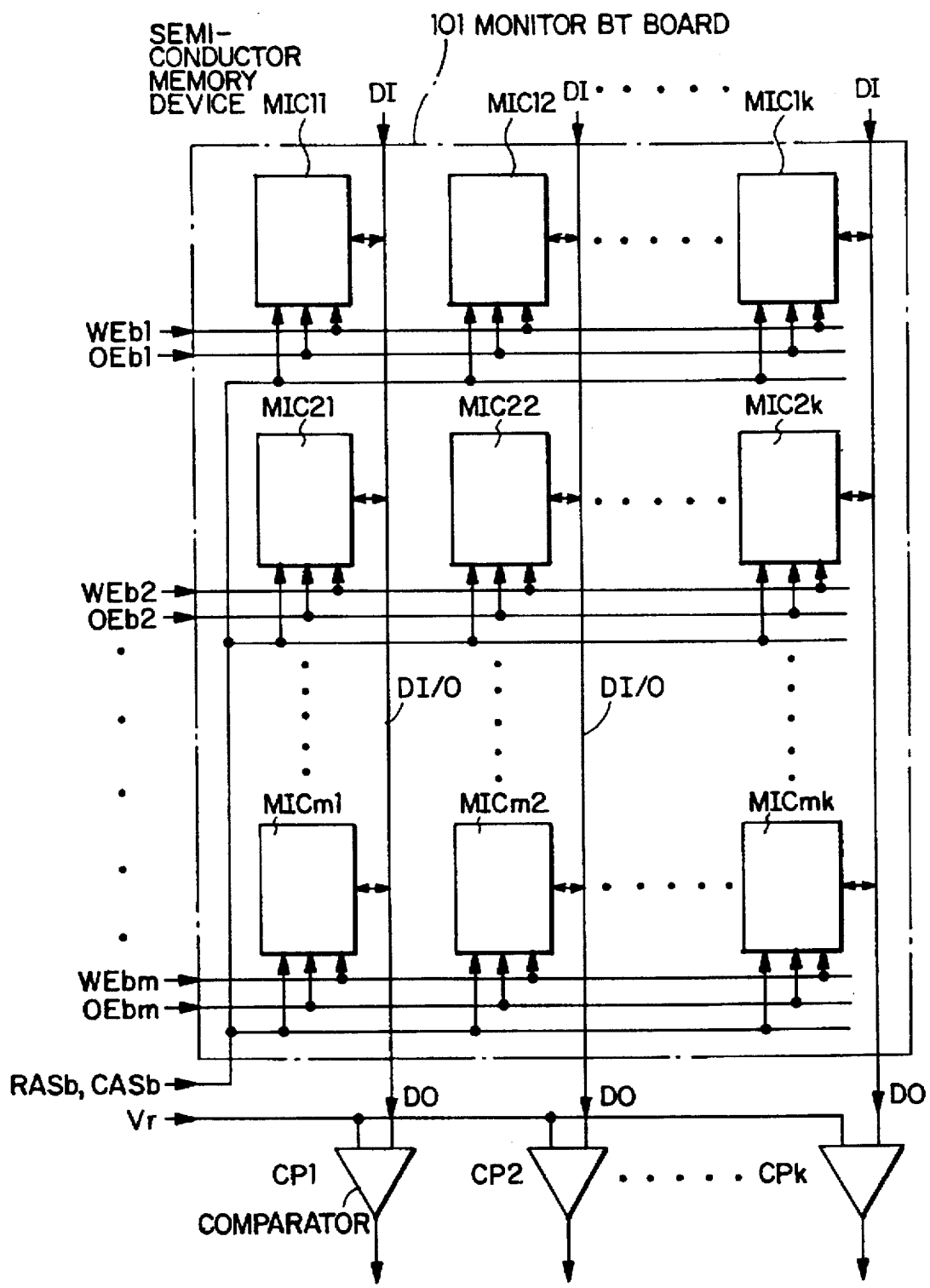
FIG. 1 is a diagram illustrating a memory test device currently in general use for carrying out simultaneously various kinds of test for a plurality of semiconductor memory devices.

Next, the testing time in the case where a plurality of aforementioned semiconductor memory devices are loaded onto the generally employed monitor BT board 101 shown in FIG. 1 will be described. Here, the conventionally employed monitor BT board 101 will be used without special modifications.

A total of m×k (for example, m=15 and k=16) semiconductor memory devices of this embodiment are loaded onto the monitor BT board 101. First, Write CAS Before RAS (WCBR) cycle is executed to put all of the semiconductor memory devices to the test mode. Next, after starting the register reset cycle, the write cycle and the decision cycle (of cycle time Tc) are executed repeatedly according to a predetermined test pattern (for example, the 9N marching system). Since the above-mentioned operations are given simultaneously to the m×k semiconductor memory devices, the test results for all the semiconductor memory devices are stored in the decision result register 7 at the completion of the decision cycle. In other words, the test result for all the semiconductor memory devices on the monitor board can be obtained by one time of test.

After completion of the predetermined test pattern, the test result for k memories in a row (for example, from MIC11 to MIC1k) is output to the input and output line by starting the decision result output cycle. By repeating this operation for m times it is possible to decide pass or failure for all of the m×k semiconductor memory devices.

The testing time for this operation is, for the case of the 9N marching system, 9N×M×Tc+mTc+Tc, where M is the total number of 4-bit sets of memories and Tc is the one cycle time (for write and decision). In this expression, mTc in the second term represents the decision result output cycle and Tc in the third term is the register reset cycle. Since m+1 is very small compared with 9N×M, the last two terms can be neglected. Therefore, the testing time becomes 9N×M×Tc which is 1/m of the conventional testing time.

Figure 8:
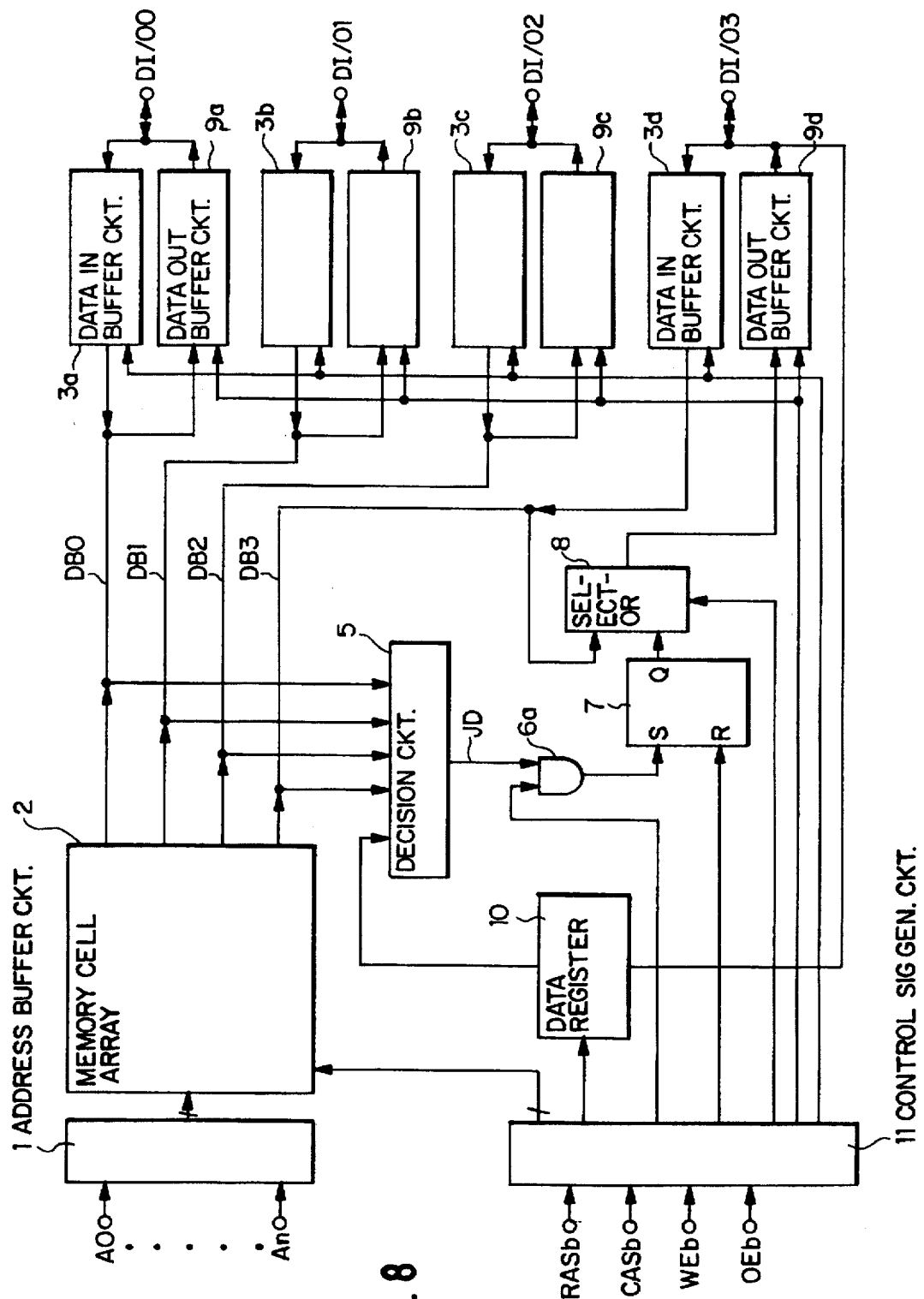
FIG. 8 is a block diagram for a semiconductor device showing a second embodiment of the invention.

Next, referring to FIG. 8, the second embodiment of the invention will be described. This embodiment represents a semiconductor memory device which, in the normal mode, writes different data of 4 bits at the same address in the memory cell array, then reads the data. The difference in constitution of this embodiment from that of the first embodiment is that each of the data busies DB0 to DB3 is connected to the corresponding data-in buffer (3a to 3d) and data-out buffer (9a to 9d) without intermediary of a selector (see FIG. 2).

Since the read and write operation during the normal mode differs from that of the first embodiment in that 4-bit data are written and read by always using all of the data buses, instead of selecting each data bus DB0 to DB3 by means of the selector, and since other operations are basically the same as those of the first embodiment, a detailed description of this embodiment will be omitted.

During the test mode, in the read cycle, identical data are supplied to the four data-in buffers (3a to 3d), and are written simultaneously to the memory cell array 2 via data buses DB0 to DB3. Next, in the decision cycle, comparison data DC with the same level as that of the data written in the write cycle are supplied from the data-in buffer 3d in response to a latch signal, and then stored. In parallel with this, 4-bit data are read from the memory cell array 2 and are supplied to the decision circuit 5. The decision circuit 5 decides whether all of the comparison data and the 4-bit data coincide, and the decision result is stored in the decision result register 7. Next, in the decision result output cycle, a decision result signal is output to the input and output terminal DI/O via the selector 8 and the data out buffer 9d.

In the aforementioned operations, the operations of the various kinds of control signal or the like supplied by the control signal generating circuit 11 are the same as in the first embodiment.

Although the two embodiments in the above have been described with reference to a DRAM, this invention is not limited to these examples, and can be adapted to memories which require a read and write test pattern, for example, a RAM such as SRAM. Furthermore, an example of 4-bit input and output has been described in these embodiments, but the number of bits can be anything so long as it is a plural number.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory device, having a normal operation mode and a test mode, comprising:

a plurality of memory cells, means for detecting initiation of said test mode and for producing a test mode signal having a first level and a second level, wherein a test operation is repeated a plurality of times according to a predetermined test pattern, said test operation including a data write operation and a data read operation, write/read means for writing one bit data into at least one of said memory cells and for reading out one bit data from said at least one of said memory cells in response to said test mode signal having said first level, and for writing test data into a plurality of said memory cells and for simultaneously reading out data from said plurality of said memory cells in response to said test mode signal having said second level, a comparison data register for receiving and temporarily storing said test data, a decision circuit, operating each time said data is read from said plurality of said memory cells, which compares said data read out from said plurality of said memory cells with said test data stored in said comparison data register and which outputs a decision signal having a first level when said data and said test data are coincident with one another and having a second level when said data and said test data supplied to said decision circuit are not coincident with one another, a decision result register, coupled to said decision circuit, which is reset when said test mode signal is at second level, and which is set to hold said decision signal when said decision signal of said second level is received, control means for outputting a control signal when said test mode is completed, and an output circuit, responsive to said control signal, to produce an output signal, supplied to an input/output terminal, indicative of a state of said decision result register.

2. The semiconductor memory device as claimed in claim 1, wherein said control means generates a plurality of internal control signals for controlling respective operations of said write/read means, said comparison data register, said decision circuit, and said decision result register, in response to a plurality of control signals supplied from outside of said semiconductor memory device.

3. The semiconductor memory device as claimed in claim 1, wherein said write/read means comprises:

a row decoder and a column decoder which select said plural ones of said memory cells in response to input addresses, a plurality of data buses respectively corresponding to said plural ones of said memory cells, and a data-in buffer circuit which supplies said test data to said plurality of data buses from a data terminal, said output signal being supplied to said data terminal from said output circuit.

4. The semiconductor memory device as claimed in claim 1, wherein said decision circuit has a gate circuit which is activated during a selected period to output said decision signal.

5. A semiconductor memory device, having a normal operation mode and a test mode, comprising:

a memory cell array, write/read means for writing one bit data to said memory cell array in response to an input address and for reading one bit data from said memory cell array during said normal operation mode, and for writing a plurality of identical data to said memory cell array in response to input addresses and for reading said plurality of data from said memory cell array during said test mode, comparison data storage means for storing test data identical to said plurality of identical data written to said memory cell array during said test mode, decision means for comparing said plurality of identical data read from said memory cell array with said test data stored in said comparison data storage means a plurality of times according to a predetermined test pattern, and for outputting a decision signal having a first level when said plurality of identical data and said test data are coincident with one another, and having a second level when said plurality of identical data and said test data supplied to said decision means are not coincident with one another, decision result storage means, which is reset immediately after start of said test mode and which is set to a set level in response to said decision signal of said second level and holds a state until it is reset again when a test mode signal is generated, and an output means for outputting an output signal indicative of said state of said decision result storage means when said test mode is completed and a decision result output mode is started, to an input/output terminal.

6. A semiconductor memory device comprising:

a memory cell array which writes in bit parallel fashion and stores a supplied unit data of a predetermined set of plural bits to predetermined addresses, and reads said unit data stored in said predetermined addresses in bit parallel fashion;

data input control means for supplying to said memory cell array said unit data of identical level for all bits supplied externally during a test mode;

a data register which fetches and outputs comparison data, externally supplied during said test mode, at predetermined timings;

a decision circuit which compares said comparison data from said data register with said unit data read from said memory cell array a plurality of times according to a predetermined test pattern, and which outputs a decision signal having a first level when said comparison data and said unit data are coincident with one another, and having a second level when said comparison data and said unit data supplied to said decision circuit are not coincident with one another;

a decision result register which is reset immediately after initiation of said test mode and which is set to a set level in response to said second level of said decision signal and holds a state until generation of a next register reset signal;

output control means for outputting, during said test mode, data held in said decision result register when an output enable signal is received by said output control means; and a control signal generating circuit which generates internal control signals, including said output enable signal, for controlling said memory cell array, said data input control means, said data register, said decision result register and said output control means;

wherein said control signal generating circuit controls an activation level and a nonactivation level of a test mode signal in accordance with a mutual level relation of a row address strobe signal, a column address strobe signal, a write enable signal and an output enable signal supplied from sources external to said semiconductor memory device, and which generates internal control signals including a register reset signal, a latch signal, a gate signal, a data input signal and a data output signal;

said semiconductor memory device further comprising:
- a data-in buffer circuit which receives a 1-bit data from one of said outside sources in response to said data input signal,
- a first selector which supplies said 1-bit data of said data-in buffer circuit to said memory cell array as said unit data of plural bits in response to said activation level of said test mode signal, and
- a gate circuit which transmits said decision signal from said decision circuit to said decision result register in response to said gate signal;

said output control means comprising:
- a second selector which selects and outputs said decision signal of said decision result register in response to said activation level of said test mode signal, and
- a data-out buffer circuit which receives and outputs said decision signal supplied from said second selector in response to said data output signal;

wherein said decision result register is reset in response to said register reset signal; and wherein said data register fetches and outputs said comparison data in response to said latch signal.

7. The semiconductor memory device as claimed in claim 6, wherein said data-in buffer circuit and said data-out buffer circuit are provided so as to correspond to respective bits of said unit data, wherein said comparison data is supplied to said data register via said data-in buffer circuit, and wherein said decision signal is output via said data-out buffer circuit.

\* \* \* \* \*

UNITED STATES PATENT AND TRADEMARK OFFICE
CERTIFICATE OF CORRECTION

PATENT NO.    : 5,673,270
DATED         : September 30, 1997
INVENTOR(S)   : Akira TSUJIMOTO It is certified that error(s) appears in the above-identified patent and that said Letters Patent is hereby corrected as shown below:

Column 2, line 8, delete "are" and delete "or not"

Column 6, line 22, delete "busies" insert --buses--;

line 58, delete "solong" insert --so long--.

Signed and Sealed this

Tenth Day of March, 1998

Attest:

BRUCE LEHMAN

Attesting Officer      Commissioner of Patents and Trademarks